United States Patent [19]
Akamatsu et al.

[11] Patent Number: 6,078,066
[45] Date of Patent: Jun. 20, 2000

[54] POWER SEMICONDUCTOR SWITCHING DEVICE

[75] Inventors: Masahiko Akamatsu; Fumio Mizohata; Mikio Bessho, all of Tokyo, Japan

[73] Assignee: Mitsubishi Denki Kabushiki Kaisha, Tokyo, Japan

[21] Appl. No.: 08/992,907

[22] Filed: Dec. 18, 1997

[30] Foreign Application Priority Data

Jun. 18, 1997 [JP] Japan ..................................... 9-161699

[51] Int. Cl.[7] .......................... H01L 29/744; H01L 29/41; H01L 29/34
[52] U.S. Cl. .......................... 257/177; 257/180; 257/724; 257/732; 361/719
[58] Field of Search ................... 257/732, 724, 257/177, 180

[56] References Cited

U.S. PATENT DOCUMENTS

| | | | |
|---|---|---|---|
| 4,520,384 | 5/1985 | Klein ........................................ | 257/724 |
| 4,975,825 | 12/1990 | Huss et al. . | |
| 5,512,790 | 4/1996 | Lachenmaier et al. . | |
| 5,519,253 | 5/1996 | Lake ........................................ | 257/724 |

FOREIGN PATENT DOCUMENTS

| | | |
|---|---|---|
| 0 328 778 | 8/1989 | European Pat. Off. . |
| 863 547 | 9/1998 | European Pat. Off. . |

OTHER PUBLICATIONS

ABB Technik May 1996 "Serienschal Tung Von GTO . . . Leistung".

*Primary Examiner*—Jerome Jackson, Jr.
*Attorney, Agent, or Firm*—Sughrue, Mion, Zinn, Macpeak & Seas, PLLC

[57] ABSTRACT

A power semiconductor switching device comprises a mounting board (110) on which a reverse bias driving circuit (20) for applying a reverse bias between the control electrode and one of two main electrodes of a GTO element (11) housed in a flat package is contained. The mounting board (110) has a through hole through which the main electrode of the GTO element (11) penetrates so that the flat package is located in the proximity of the through hole and the perimeter of the through hole partially surrounds the flat package, and a conducting member formed on one surface of the mounting board (110) and electrically connected to the control electrode of the GTO element (11).

12 Claims, 11 Drawing Sheets

POWER SEMICONDUCTOR SWITCHING DEVICE

BACKGROUND OF THE INVENTION

1. Field of the Invention

The present invention relates to improvements in a power semiconductor switching device of gate turnoff type that can be turned on or off from its control electrode.

2. Description of the Prior Art

Figure 10:
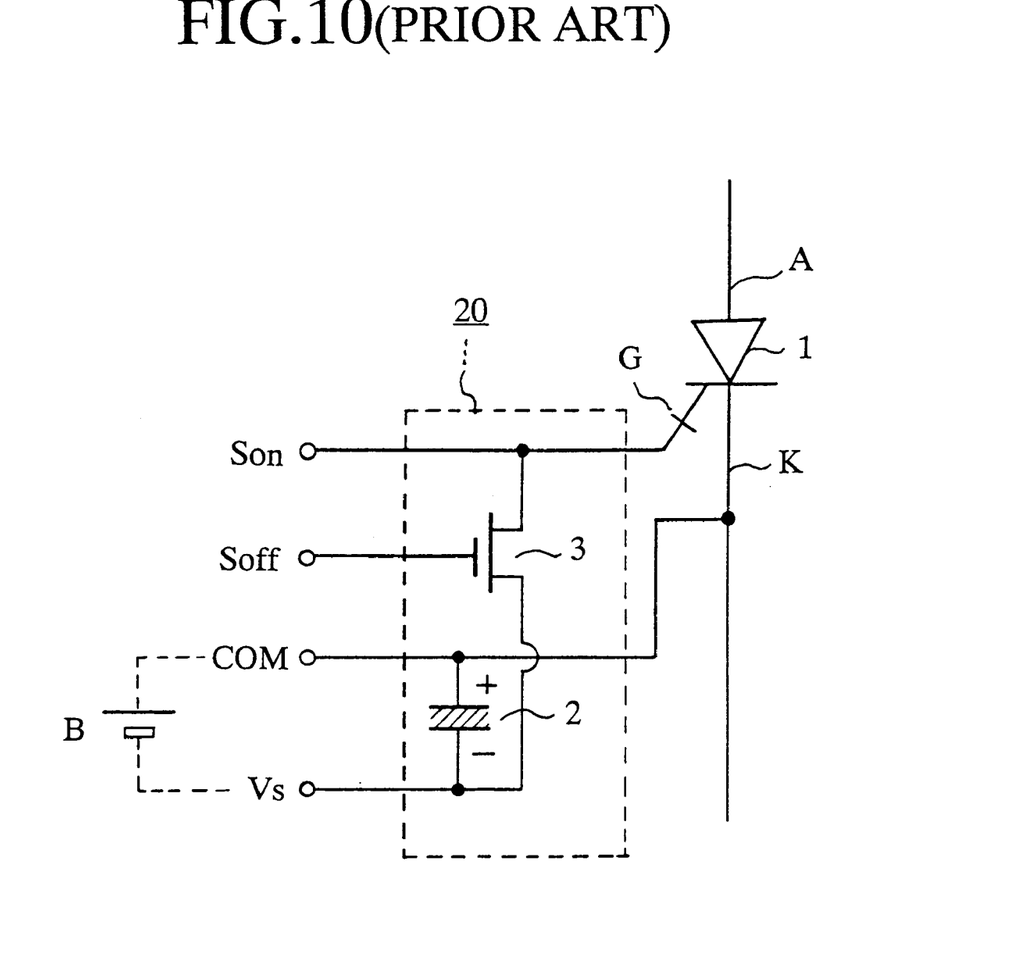
FIG. 10 is a schematic circuit diagram of a prior art power semiconductor switching device including a power semiconductor switching element such as a GTO element.

Gate turnoff thyristors, static induction transistors, or the like, each of which will be referred to as a GTO, have been known as power semiconductor switching elements suitable for the interruption of large electric currents. Referring now to FIG. 10, there is illustrated a schematic circuit diagram of a prior art power semiconductor switching device including a power semiconductor switching element such as a GTO. In the figure, reference numeral 1 denotes a semiconductor element, such as a GTO, having its anode electrode A, its cathode electrode K, and its gate electrode (i.e., control electrode) G, 20 denotes a reverse bias driving circuit for applying a reverse bias between the gate and cathode electrodes G and K, 2 denotes a storage element, such as a capacitor, for storing an electric energy to apply a reverse bias between the gate electrode G and the cathode electrode K of the semiconductor element 1 such as a GTO, and 3 denotes a reverse bias switch which can be brought into conduction so as to cause the semiconductor element 1 to make a transition from its on state to its off state by applying the electric energy stored on the storage element 2 between the cathode and gate electrodes K and G backwardly.

Reference string Son denotes a forward-bias signal terminal to which a forward bias signal is applied, Soff denotes a reverse-bias signal terminal to which a reverse bias signal is applied, Vs denotes a reverse-bias power supply terminal, B denotes a reverse-bias power supply, and COM denotes a common terminal which defines the potential of the cathode of the semiconductor element 1.

In operation, the reverse bias power supply B stores an electric energy in the storage element 2 for applying a reverse bias between the gate and cathode electrodes G and K of the semiconductor element 1. The electric energy cannot be used to apply a reverse bias between the gate and cathode electrodes G and K of the semiconductor element 1 such as a GTO so long as the reverse bias switch 3 is kept in its nonconductive state. When the semiconductor element 1, such as a GTO, remains in its off state first, the application of a forward bias signal via the forward bias signal terminal Son with respect to the common terminal COM causes the semiconductor element 1, such as a GTO, to make a transition from its off state to its on state.

In order to cause the semiconductor element 1, such as a GTO, which has been turned on to make a transition to its off state, it is necessary to set and hold the anode current at zero for a predetermined period of time without the application of the forward bias signal to the forward bias signal terminal Son, or to apply a reverse bias between the gate and cathode electrodes G and K of the element 1. In the latter case, the reverse bias switch 3 can be brought into conduction by applying a reverse bias signal from the reverse bias signal terminal Soff to the reverse bias switch 3 so that the electric energy stored in the storage element 2 is used for applying a reverse bias between the gate and cathode electrodes G and K of the semiconductor element 1.

In such the prior art power semiconductor switching device, a connection between the driving circuit 20 for controlling the conduction between the anode and cathode electrodes A and K and the semiconductor element 1 such as a GTO is established by lead lines extended from the cathode and gate electrodes K and G. While it is necessary to precisely control the conductivity of the power semiconductor switching device by means of the reverse bias driving circuit 20 in order to improve its responsivity and reliability, it is difficult to generate a sufficiently large reverse bias gate current having a sufficiently large varying rate of (−dIg/dt), where Ig is the reverse bias gate current, because of the impedance of the lead lines which poses a barrier to the generation of such a rapidly-varying large reverse bias gate current. This results in restricting the interruption capability of the semiconductor element 1 such as a GTO. It is thus difficult to improve the interruption capability of the semiconductor element 1 within the prior art power semiconductor switching device.

Figure 11:
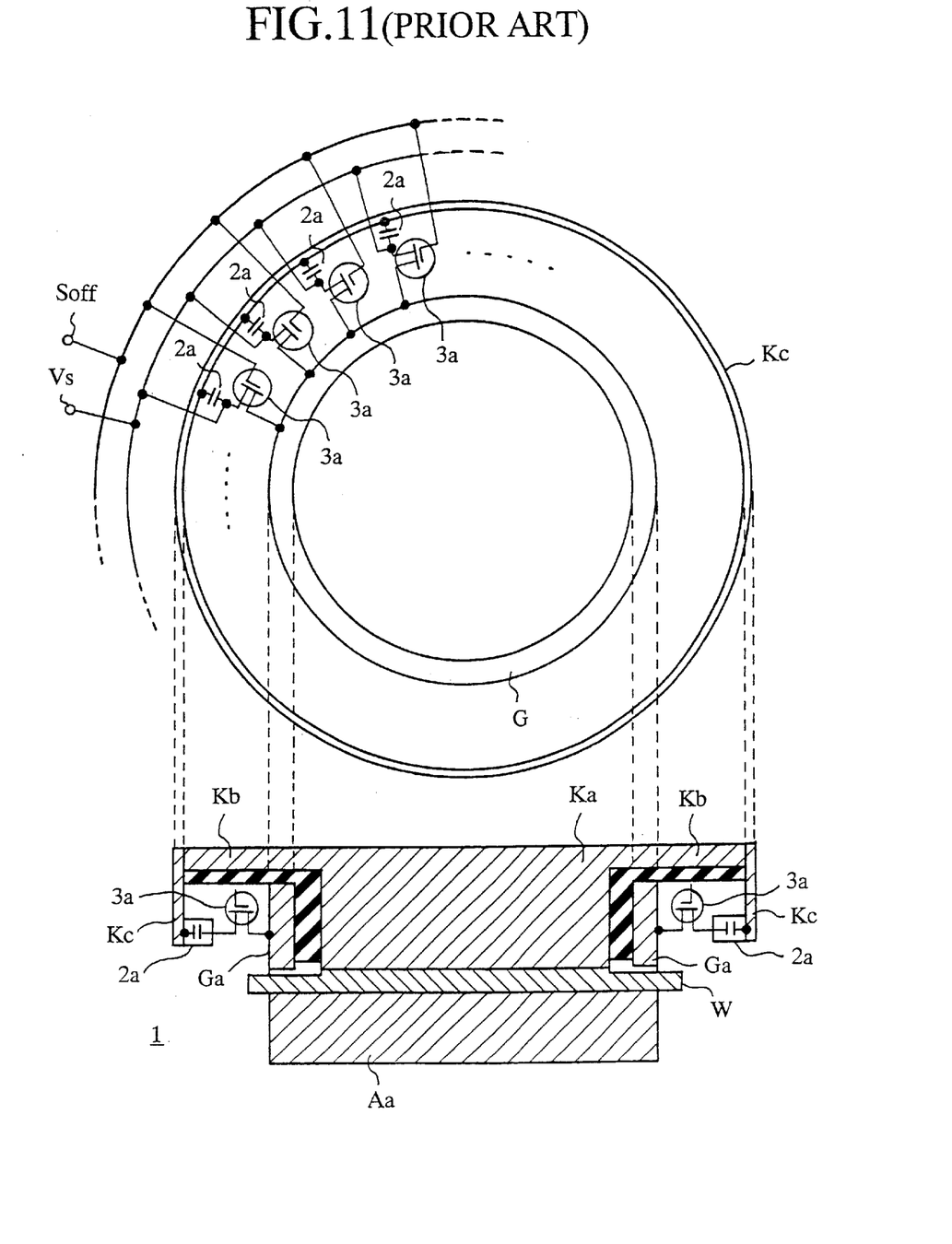
FIG. 11 is a diagram showing the structure of a prior art power semiconductor device in which a concept of packaging a power semiconductor device is made concrete.

Europe Patent No. 0 328 778 B1 discloses a concept of packaging a power semiconductor device. Referring next to FIG. 11, there is illustrated a diagram showing the structure of a prior art power semiconductor device in which the packaging concept is made concrete. In the figure, reference character W denotes a power semiconductor wafer, Aa denotes a first copper block electrode which serves as an anode electrode, Ka denotes a second copper block electrode which serves as a cathode electrode, Kb and KC denote extended cathode electrodes which are electrically connected to the second copper block electrode Ka, and Ga denotes a cylindrical-shaped gate electrode which is brought into contact with the gate surface of the power semiconductor wafer W.

In the packaged power semiconductor device shown in FIG. 11, the reverse bias driving circuit is constructed of a number of series circuits each comprised of a capacitor 2a and a reverse bias switch 3a. The number of series circuits are arranged between the cylindrical-shaped gate and expanded cathode electrodes Ga and Kc. The reverse bias driving circuit constructed of the number of series circuits each comprised of one capacitor 2a and one reverse bias switch 3a is thus housed together with the power semiconductor wafer W within the same package.

Although such the packaging concept for power semiconductor switching devices offers the hope of improving its interruption capability since the inductance caused by the lead line extended from the gate electrode in the prior art switching device shown in FIG. 10 is eliminated and hence the varying rate (−dIg/dt) of the reverse bias gate current is increased, it suffers from a disadvantage that the voltage drop in each reverse bias switch 3a such as a MOSFET is increased and hence its conduction capability is reduced because all the components of the reverse bias driving circuit are disposed within the package including the power semiconductor wafer W held at a high temperature of 125° C.

Another problem with the packaged power semiconductor switching device is that each capacitor 2a cannot withstand exposure to such the high temperature, or reduction in the capacitance caused by size constraints makes it difficult to feed a sufficient reverse bias current, or supply a sufficient charge which is the time integral of a sweep out current. For example, electrolytic capacitors and organic semiconductor capacitors cannot be used because of their low heat resistance from the viewpoint of their needed useful life. Laminated ceramic capacitors cannot be used because of their small capacitances and because their capacitances are decreased remarkably when they are placed in environments at high temperatures as mentioned above. If such capacitors are forcedly incorporated into the prior art power semiconductor switching device as shown in FIG. 11, the reliability of the components which construct the reverse bias driving circuit is reduced.

SUMMARY OF THE INVENTION

The present invention is made to overcome the above problems. It is therefore an object of the present invention to provide a power semiconductor switching device in which improvements are made to increase both the interruption capability and the reliability and to facilitate the implementation of the power semiconductor switching device.

In accordance with the present invention, there is provided a power semiconductor switching device comprising: a power semiconductor switching element housed within a flat package and provided with first and second main flat electrodes between which a main current flows when the power semiconductor switching element is turned on, and a control electrode which is shaped like a ring and which projects outwardly from the flat package and pairs up with the second main flat electrode for controlling electrical conduction between the first and second main flat electrodes; a forward bias driving circuit for applying a forward bias between the control electrode and the second main electrode; a reverse bias driving circuit including a plurality of storage elements arranged around the perimeter of the control electrode of the power semiconductor switching element, for storing an electric energy supplied by a reverse bias power supply to apply a reverse bias between the control electrode and the second main electrode, and a plurality of switching elements each connected in series to each of the plurality of storage elements, which can be turned on to apply the electric energy stored in the plurality of storage elements between the control electrode and the second main electrode; and a mounting board on which the reverse bias driving circuit is contained, the mounting board having a through hole through which the second main electrode of the power semiconductor switching element penetrates so that the flat package is located in the proximity of the through hole and the perimeter of the through hole partially surrounds the flat package, and a conducting member formed on one surface of the mounting board and electrically connected to the control electrode of the power semiconductor switching element.

Preferably, the power semiconductor switching device further comprises a highly conductive metallic plate which is securely brought into contact with one flat surface of the second main electrode and a good-conductive ferrule. Furthermore, the highly conductive metallic plate and the ferrule sandwich the control electrode and the mounting board between them in cooperation with each other.

In a preferred embodiment, the forward bias driving circuit is located apart from the reverse bias driving circuit. The power semiconductor switching device can comprise another board which is separated from the mounting board on which the reverse bias driving circuit is contained, and the forward bias driving circuit can be contained on the other board. Preferably, the reverse bias power supply is also contained on the other board.

The power semiconductor switching device can further comprise a preliminary driving circuit disposed on the mounting board and located in the vicinity of the reverse bias driving circuit, for driving the plurality of switching elements of the reverse bias driving circuit.

In accordance with another preferred embodiment of the present invention, the through hole divides one surface of the mounting board on which the reverse bias driving circuit is contained into two surface regions, and the reverse bias driving circuitry includes first and second reverse bias driving circuits which are separately disposed on the two respective surface regions which are opposite to each other across the through hole.

Preferably, the power semiconductor switching device further comprises first and second preliminary driving circuits disposed on the two respective surface regions of the mounting board, for respectively driving corresponding switching elements of the first and second reverse bias driving circuits which are contained on the two respective surface regions on the mounting board.

Further objects and advantages of the present invention will be apparent from the following description of the preferred embodiments of the invention as illustrated in the accompanying drawings.

BRIEF DESCRIPTION OF THE DRAWINGS

FIG. 4b shows a side view of the power semiconductor switching device shown in FIG. 4a;

FIG. 5b is a cross-sectional view of the power semiconductor switching element shown in FIG. 5a;

FIG. 7b is a side view of the power semiconductor switching device according to the second embodiment of the present invention shown in FIG. 7a;

FIG. 8b is a side view of the other board and the chassis shown in FIG. 8a;

FIG. 9b is a cross-sectional view of the power semiconductor switching element shown in FIG. 9a;

DETAILED DESCRIPTION OF THE PREFERRED EMBODIMENTS

First Embodiment

Figure 1:
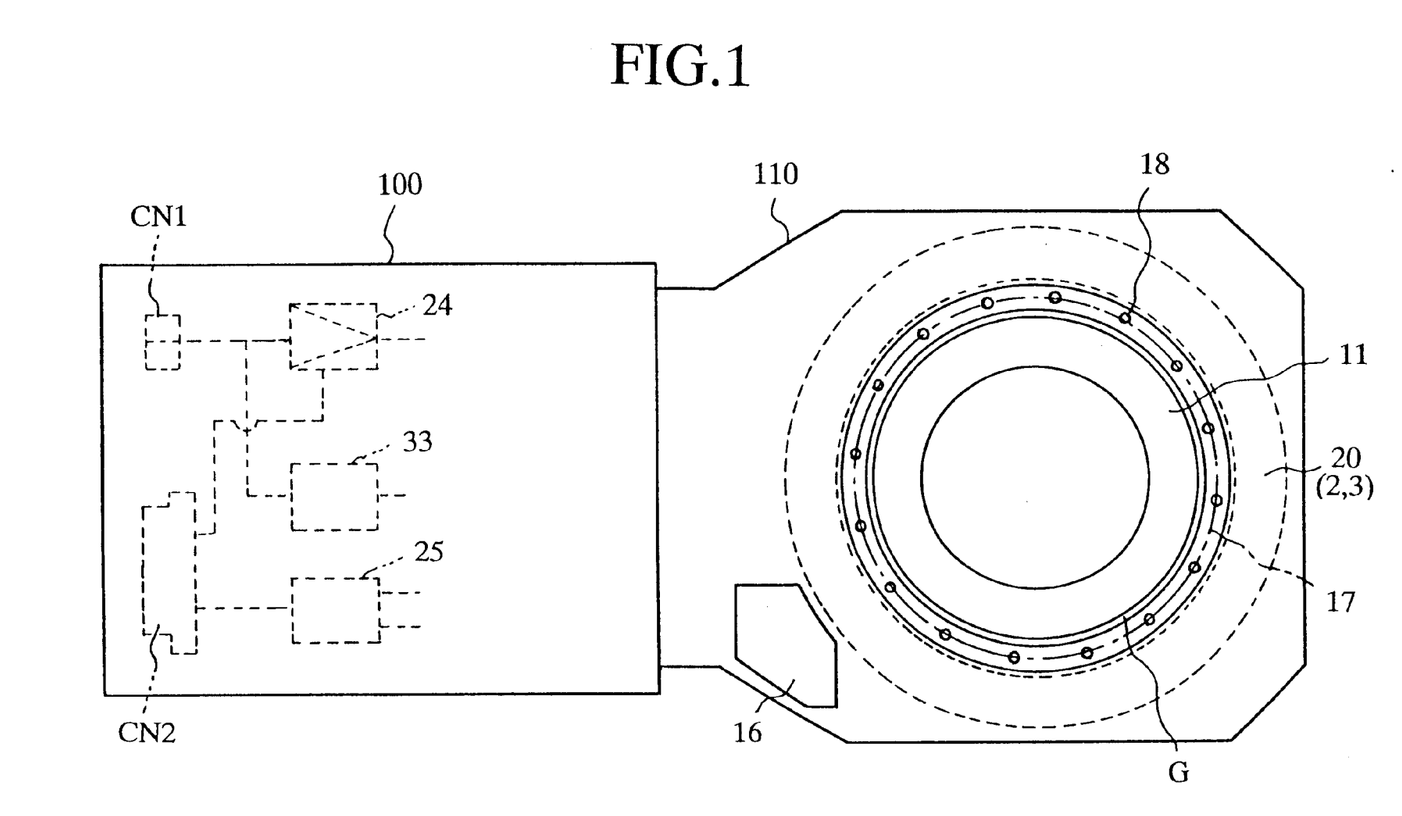
FIG. 1 is a plan view showing the structure and arrangement of a power semiconductor switching device according to a first embodiment of the present invention.

Referring next to FIG. 1, there is illustrated a plan view showing the structure and arrangement of a power semiconductor switching device according to a first embodiment of the present invention. In the figure, reference numeral 11 denotes a power semiconductor switching element of gate turnoff type housed in a flat package, which will be referred to as a GTO element, and 110 denotes a mounting board on which various circuits that are needed to operate the GTO element 11 are mounted or contained. The GTO element 11 is provided with a gate electrode (or control electrode) G which is shaped like a ring, and the peripheral portion of which projects outwardly from the perimeter of the GTO element 11 housed in the flat package, a first main electrode (not shown), and a second main electrode (not shown) which pairs up with the gate electrode. The GTO element 11 can be turned off by applying a reverse bias between the gate and second main electrodes. In the case where the GTO element 11 is of PNP type, the first main electrode is referred to as "anode electrode" and the second main electrode is referred to as "cathode electrode". In the following description, assume that the GTO element 11 is of PNP type. Furthermore, reference numeral 20 denotes a reverse bias driving circuit constructed of a number of storage elements 2 not shown in the figure (see FIG. 2), such as capacitors, each for storing part of an electric energy to apply a reverse bias between the gate and second main electrodes of the GTO element 11, and a number of reverse bias switches 3 not shown in the figure (see FIG. 2), each of which is connected in series to each of the plurality of storage elements 2, and 16 denotes a preliminary driving circuit for controlling the plurality of reverse bias switches 3 of the reverse bias driving circuit 20. Furthermore, reference numeral 17 denotes an electrically conductive ferrule for pushing the gate electrode G shaped like a ring downward so that the gate electrode G can be electrically brought into contact with a gate driving output (not shown) through which a reverse bias from the reverse bias driving circuit 20 is applied between the gate electrode G and the second main electrode, and 18 denotes each of a plurality of screw holes made in the ferrule 17, into which a plurality of screws are inserted for securing the ferrule 17 and the gate electrode G to the gate driving output not shown.

Furthermore, reference numeral 24 denotes a forward bias driving circuit, 25 denotes a reverse bias power supply, CN1 denotes a first connector including an input to which a control signal from outside is applied to trigger the reverse bias driving circuit 20 to apply a reverse bias between the control and second main electrodes of the GTO element 11, CN2 denotes a second connector including an input connected to the forward bias driving circuit 24 for supplying power to the forward bias driving circuit 24 and another input connected to the reverse bias power supply 25 for supplying power to the reverse bias power supply 25, 33 denotes a buffer for furnishing a predetermined signal to the preliminary driving circuit 16 in response to the control signal applied thereto via the first connector CN1, and 100 denotes a chassis which houses the forward bias driving circuit 24, the reverse bias power supply 25, the buffer 33, the first and second connectors CN1 and CN2, and so on.

Figure 2:
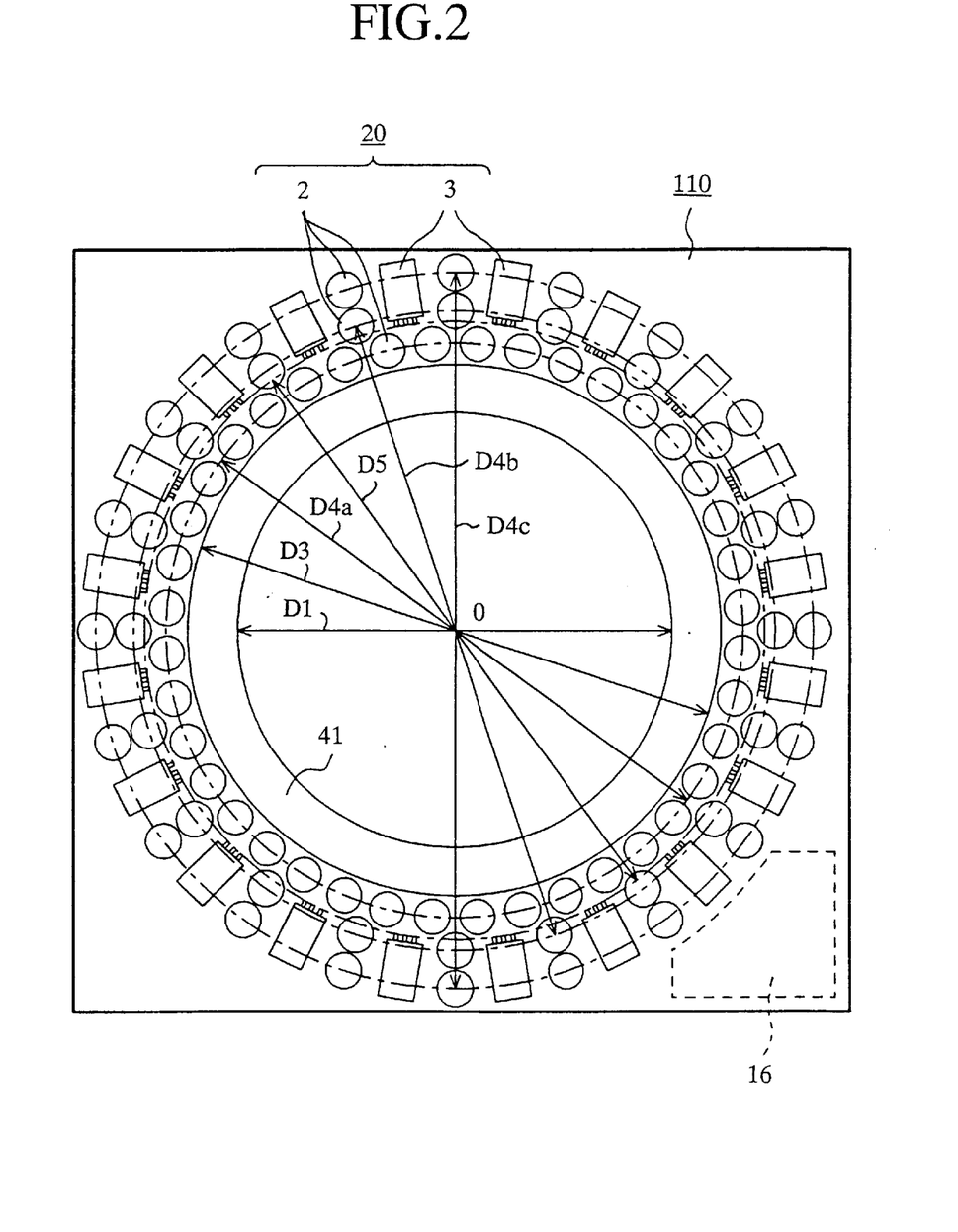
FIG. 2 is a plan view showing the structure of an example of a reverse bias driving circuit contained on a mounting board of the power semiconductor switching device according to the first embodiment of the present invention shown in FIG. 1.
Figure 3:
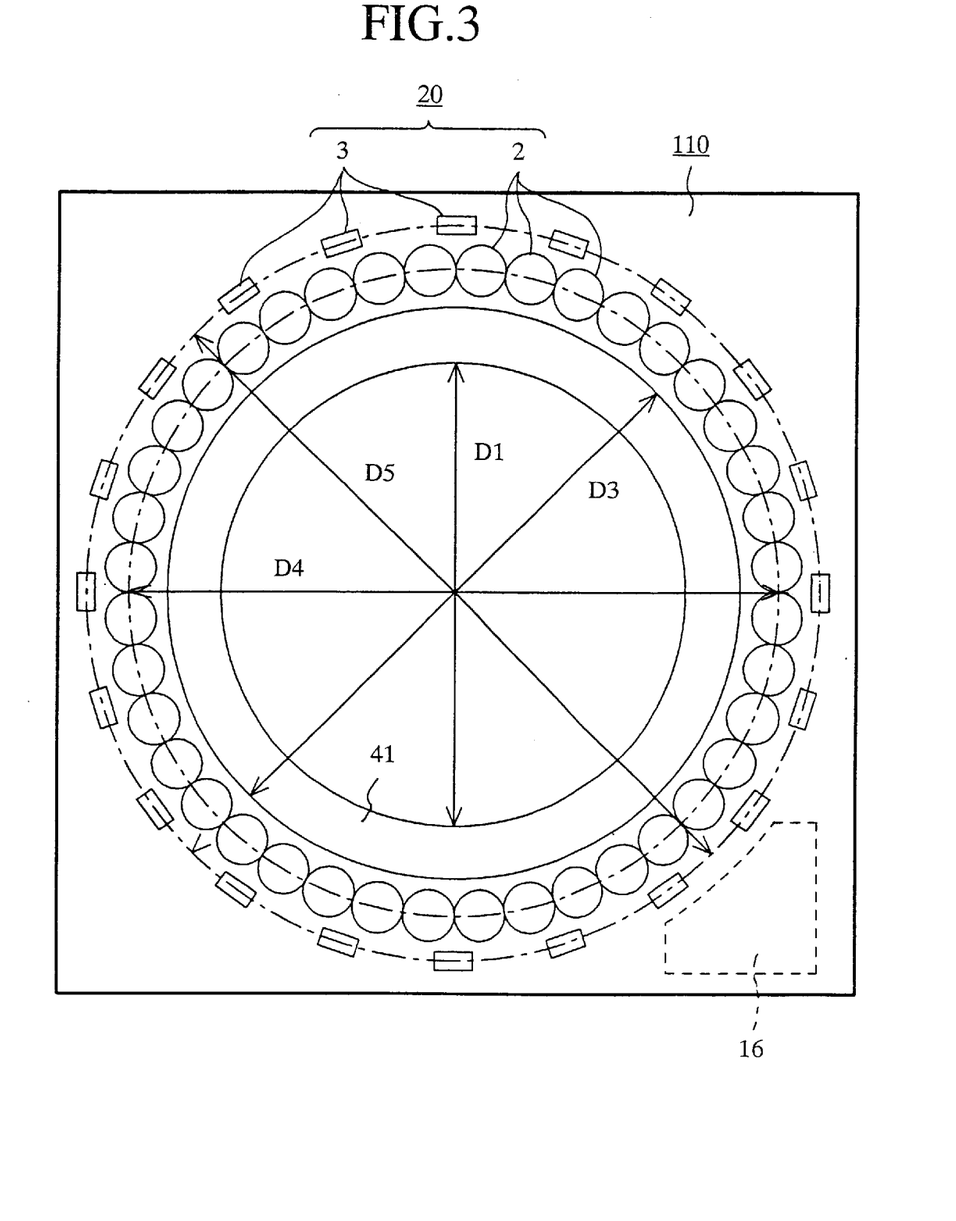
FIG. 3 is a plan view showing the structure of another example of the reverse bias driving circuit contained on the mounting board of the power semiconductor switching device according to the first embodiment of the present invention shown in FIG. 1.

A description will be made as to the structure of the reverse bias driving circuit 20 contained on the mounting board 110 shown in FIG. 1. Referring next to FIGS. 2 and 3, there are illustrated plan views of examples of the reverse bias driving circuit 20 mounted on the mounting board 110. Reference string D1 in FIGS. 2 and 3 denotes the diameter of a through hole through which a copper block member (not shown) that serves as the second main flat electrode of the GTO element 11 can be inserted, 41 in FIGS. 2 and 3 denotes the aforementioned gate driving output, i.e., a conducting member which is formed on the surface of the mounting board 110 and which is securely brought into contact with the ring-shaped gate electrode G of the GTO element 11, with the gate electrode G electrically connected to the gate driving output 41, D3 in FIGS. 2 and 3 denotes the diameter of the outer perimeter of the gate driving output 41, D4a through D4c in FIG. 2 denote the diameters of circles along which a number of storage units 2 of the reverse bias driving circuit 20 are arranged concentrically on the perimeter of the mounting board 110 around the gate driving output 41, D4 in FIG. 3 denotes the diameter of a circle along which a plurality of storage units 2 of the-reverse bias driving circuit 20 are arranged on the perimeter of the mounting board 110 around the gate driving output 41, and D5 in FIGS. 2 and 3 denotes the diameter of a circle along which a plurality of reverse bias switches 3 of the reverse bias driving circuit 20 are arranged. In FIGS. 2 and 3, the flat package for the GTO element 11 is omitted in the illustration.

As can be seen from FIGS. 1, 2, and 3, the power semiconductor switching device of the first embodiment of the present invention is so constructed that the power semiconductor wafer (not shown) is housed within the flat package. Since the reverse bias driving circuit 20 is not housed within the flat package, the reverse bias driving circuit 20 is unaffected by a thermal adverse effect due to heat generated in the power semiconductor wafer (not shown) and hence the power semiconductor switching device of the first embodiment can ensure a high degree of reliability.

Furthermore, since the reverse bias driving circuit 20 is arranged on the perimeter of the mounting board 110 which is located outside the ring-shaped gate electrode G, the impedance of the loop of the circuit comprised of the gate circuit for the GTO element 11 and the reverse bias driving circuit 20 from the number of storage elements 2, by the way of the second main electrode not shown, the gate electrode G, and the number of reverse bias switches 3, to the number of storage elements 2 can be reduced exceedingly. Accordingly, the reverse bias driving circuit 20 can apply a reverse bias having a high rate of change of current, i.e. a large (−dIg/dt), between the gate electrode G and the second main electrode, and having a large amount of current even though the amplitude of the bias voltage generated by the reverse bias power supply is limited. When the amplitude of the gate reverse bias current reaches that of the anode current or it exceeds that of the anode current by a small amount, the destination of the anode current makes a transition from the cathode electrode to the gate electrode and hence the gate-cathode junction is reverse-biased completely. The GTO element 11 is turned on when the gate layer (Pb)-cathode layer (Nk) junction is reverse-biased completely. Accordingly, the maximum permissible amplitude of the current flowing through the GTO element 11 upon turning off the GTO element 11 is increased and therefore the maximum amplitude of the current which can be interrupted by the GTO element 11 is increased. In addition, since a rapidly-varying (i.e., large (–dIg/dt)) and large reverse bias current is placed between the gate and cathode electrodes of the GTO element 11, the storage time (i.e., carrier sweeping-out time) Ts is decreased exceedingly. Thus the power semiconductor switching device of this embodiment can offer high-speed switching operations and can increase in its interruption performance or its interruption capability.

The preliminary driving circuit 16 for driving the number of reverse bias switches 3 of the reverse bias driving circuit 20 as shown in FIG. 2 or 3 is also included on the mounting board 110 on which the reverse bias driving circuit 20 is contained, as shown in FIG. 1. The preliminary driving circuit 16 is located in the vicinity of the reverse bias driving circuit 20. The loop impedance of the circuit including the gates of the number of reverse bias switches 3 and the preliminary driving circuit 16 is thus reduced. As a result, the amplitude of voltages applied to the gates of the number of reverse bias switches 3 can be stabilized and hence a malfunction in each reverse bias switch 3 which is caused by a noise introduced between the preliminary driving circuit 16 and each reverse bias switch 3 can be prevented. That is, the arrangement of the preliminary driving circuit 16 prevents each reverse bias switch 3 of the reverse bias driving circuit 20 from receiving a noise from the GTO element 11 across which a high voltage is applied and through which a large current is passed, and therefore from failing to work properly.

In addition, since the forward bias driving circuit 24 is arranged apart from the reverse bias driving circuit 20, the forward bias driving circuit 24 is resistant to an induced noise caused by the large reverse bias current with a high rate of change (–dIg/dt). Furthermore, arranging the forward bias driving circuit 24 apart from the GTO element 11 improves the flexibility of the implementation of the power semiconductor switching device of this embodiment. Also, arranging the reverse bias power supply 25 apart from the reverse bias driving circuit 20 improves the flexibility of the implementation of the power semiconductor switching device.

Figure 4A:
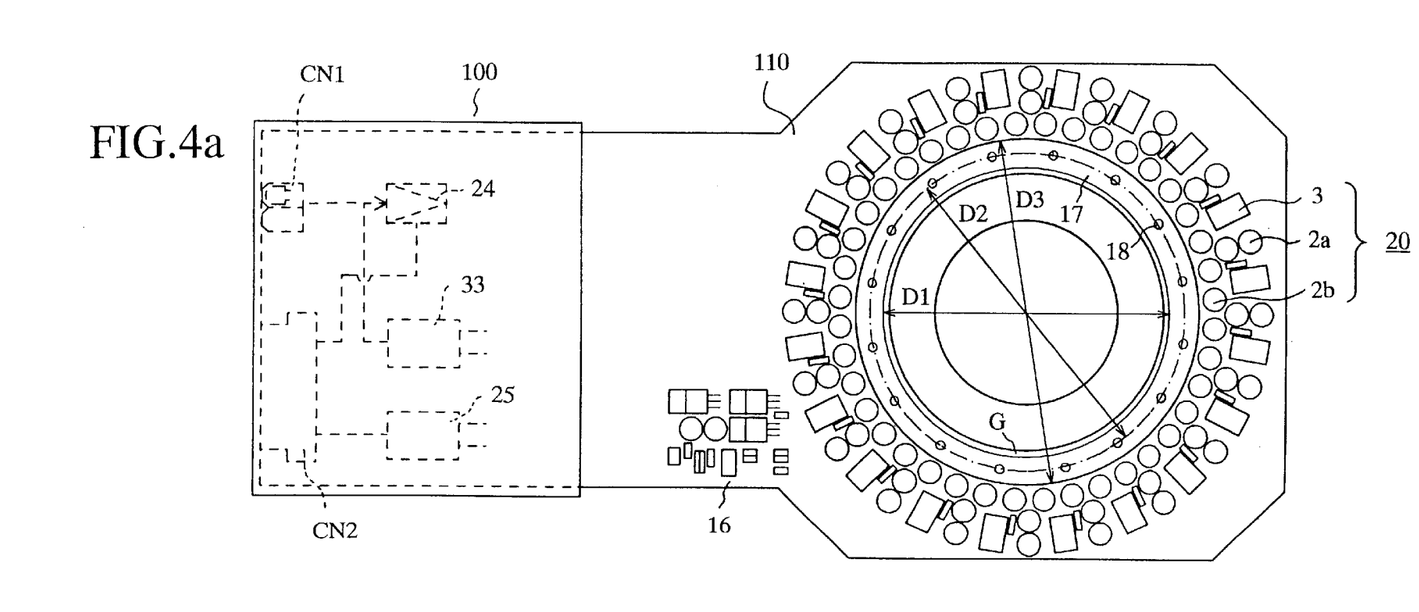
FIG. 4a is a plan view showing the structure of the power semiconductor switching device according to the first embodiment of the present invention shown in FIG. 1.
Figure 4B:
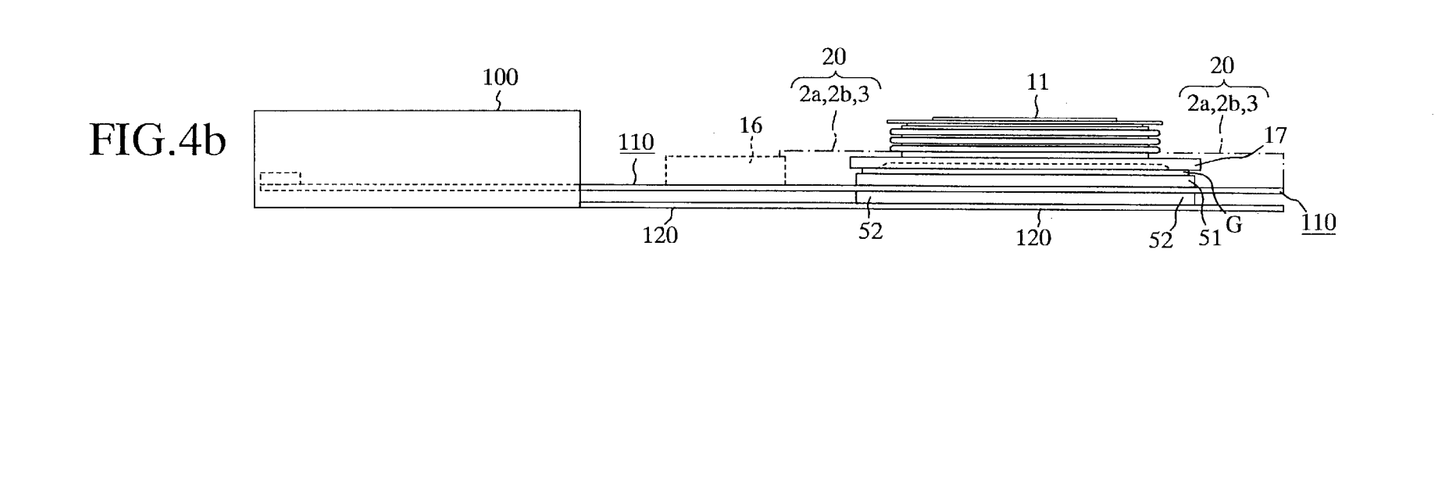

Referring next to FIG. 4a, there is illustrated a plan view showing the detailed structure of the power semiconductor switching device according to the first embodiment of the present invention. FIG. 4b shows a side view of the power semiconductor switching device shown in FIG. 4a. Furthermore, FIG. 5a shows a side view, partially in section, showing the installation of the GTO element 11 into the power semiconductor switching device shown in FIGS. 4a and 4b, and FIG. 5b shows a cross-sectional view of the GTO element 11 shown in FIG. 5a.

In FIG. 4a, reference string D2 denotes the diameter of a circle along which a plurality of screw holes 18 in the ferrule 17 into which a plurality of screws are inserted for securing the ferrule 17 are arranged. In FIG. 4b, reference numeral 120 denotes a highly conductive metallic plate for sandwiching the ring-shaped gate electrode G and the mounting board 110 between the metallic plate 120 and the ferrule 17 so as to secure the ring-shaped gate electrode G to the mounting board 110. The metallic plate 120 is securely brought into contact with the bottom surface of the second main electrode (not shown) of the GTO element 11. The highly conductive metallic plate 120 is electrically connected to the chassis 100 and is mechanically coupled to the chassis 100, as shown in FIG. 4b. Furthermore, in FIGS. 4b, 5a, and 5b, reference numeral 51 denotes a metallic spacer which is shaped like a ring and is sandwiched between the gate driving output 41, as shown in FIG. 2, formed on the surface of the mounting board 110 and the gate electrode G, and 52 denotes a metallic spacer which is sandwiched between a cathode conducting member (not shown) formed on the underside of the mounting board 110 and the highly conductive metallic plate 120. Both the metallic spacers 51 and 52 serve to maintain the proper dimensional relation among the top of the GTO element 11, which is electrically connected to the first main electrode not shown, the gate electrode G, the mounting board 110, and the metallic plate 120 according to a predetermined distance between the bottom surface of the second main electrode and the ring-shaped gate electrode G. In FIG. 4b, while the whole of the ferrule 17 and the metallic space 51 can be seen, actually, they are hidden from view by the reverse bias driving circuit 20.

Figure 5A:
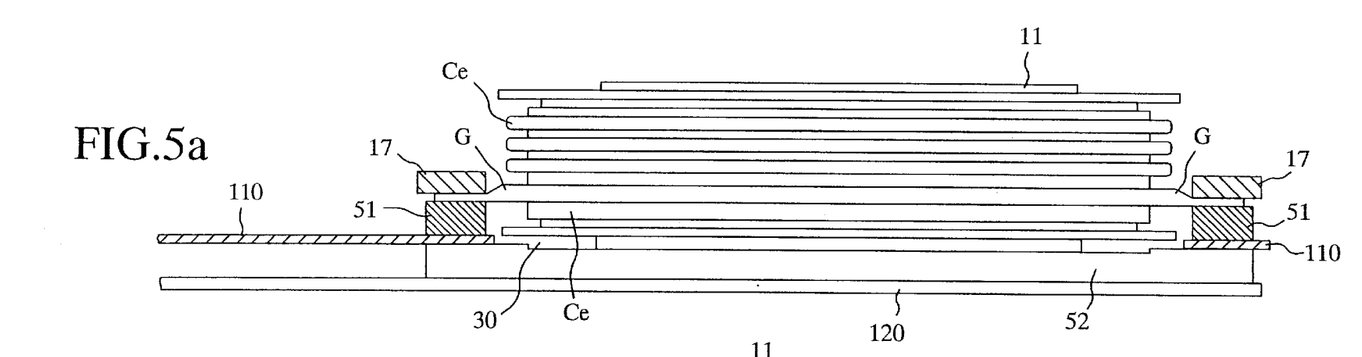
FIG. 5a is a side view, partially in section, showing the structure of a power semiconductor switching element of the power semiconductor switching device shown in FIGS. 4a and 4b.

In FIG. 5a, reference string Ce denotes a ceramic package which is part of the flat package for packaging the GTO element 11 therein. The ferrule 17, the metallic spacer 51, and the mounting board 110 are shown in section. In FIG. 5b, reference numeral 54 denotes a screw for securely sandwiching the gate electrode G between the ferrule 17 and the metallic spacer 51, and 57 denotes a screw which penetrates through the mounting board 110, for securely sandwiching the mounting board 110 between the metallic spacers 52 and 51. Furthermore, reference numeral 56 denotes an isolating bushing for preventing shorting of the gate electrode G and the second main electrode not shown by way of the screw 57, and 55 denotes a screw for securing the metallic spacer 52 to the highly conductive metallic plate 120.

Figure 5B:
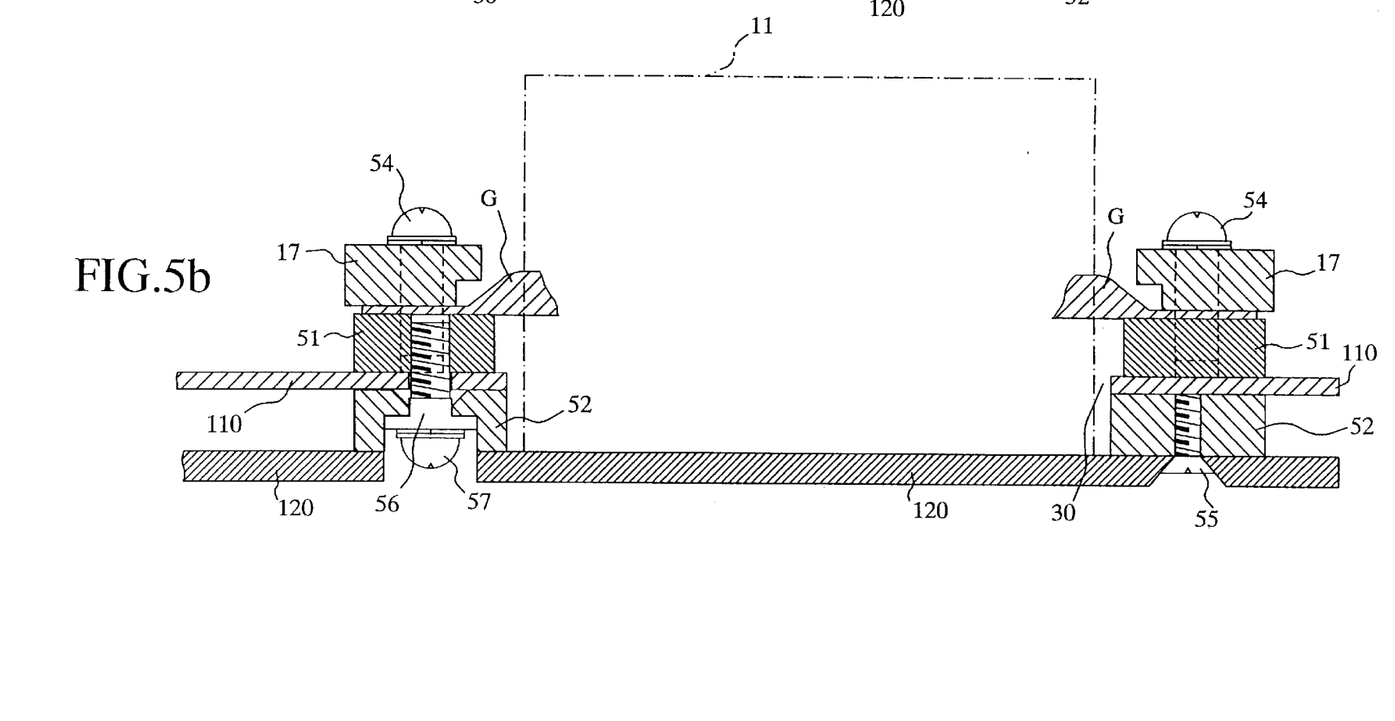

As can be seen from FIGS. 5a and 5b, the second main electrode (not shown) of the GTO element 11 penetrates through the through hole 30 so that the flat package including the ceramic package Ce is located in the proximity of the through hole 30 and the perimeter of the through hole 30 partially surrounds the flat package.

Each screw 54 is engaged with one threaded hole in the metallic spacer 51, and each screw 57 penetrates through one through hole made in the metallic spacer 52 and one through hole 18, as shown in FIG. 1, made in the mounting board 110 and is also engaged with one threaded hole in the metallic spacer 51 with each screw 57 isolated from the metallic spacer 52. As a result, the installation position of the metallic spacer 51 with respect to the mounting board 110 is defined by the plurality of screws 54. The determination of the installation position of the metallic spacer 51 also defines the installation positions of the ferrule 17 and the GTO element 11. Furthermore, the installation position of the metallic spacer 52 secured to the good-conductive metallic plate 120 with respect to the mounting board 110 is defined by the plurality of screws 57.

As previously mentioned, the cathode conducting member (not shown) which can be electrically connected to the second main electrode (not shown) of the GTO element 11 is formed on the underside of the mounting board 110. The electrical connection between the cathode conducting part formed on the underside of the mounting board 110 and the second main electrode of the GTO element 11 is established by way of the highly conductive metallic plate 120, which is securely brought into contact with the second main electrode not shown, and the metallic spacer 52.

Both the gate electrode G and the mounting board 110 are thus sandwiched between the ferrule 17 and the highly conductive metallic plate 120 which is securely brought into contact with the bottom surface of the second main electrode which pairs up with the gate electrode G. The gate electrode G is thus in electric contact with the gate driving output 41, as shown in FIG. 2, formed on the surface of the mounting board 110 by way of the metallic spacer 51. Furthermore, the second main electrode which serves as the cathode electrode in this embodiment is electrically connected to the cathode conducting member (not shown) by way of the highly conductive metallic plate 120 and the metallic spacer 52 by making the bottom surface of the second main electrode in secure contact with the metallic plate 120. It is needless to say that the gate electrode G is electrically isolated from the second main electrode.

As previously explained, the power semiconductor switching device according to the first embodiment of the present invention is provided with the ferrule 17 and the highly conductive metallic plate 120 which is securely brought into contact with the bottom surface of the second main electrode (not shown) which pairs up with the gate electrode G, and the power semiconductor switching device is so constructed as to sandwich the gate electrode G and the mounting board 110 between the ferrule 17 and the highly conductive metallic plate 120. Accordingly, the power semiconductor switching device of the present embodiment provides high mechanical strength. In addition, the ferrule 17 and the metallic spacer 51 serve to make the potential of the gate electrode G consistent across the entire perimeter of the ring-shaped gate electrode G. As a result, the reverse bias applied to the gate electrode of the power semiconductor wafer housed within the flat package is consistent across the entire perimeter of the gate electrode. This results in improving the interruption capability of the power semiconductor switching device.

Furthermore, the preliminary driving circuit 16 includes electronics components such as capacitors, transistors such as MOSFETs, a signal processing integrated circuit, and a buffer integrated circuit, as shown in FIG. 4a. As previously explained, the preliminary driving circuit 16 is located in the vicinity of the reverse bias driving circuit 20, and this results in decreasing the loop impedance of the gate circuit used for driving the number of reverse bias switches 3. Accordingly, voltages applied to the gates of the number of reverse bias switches 3 can be stabilized and hence a malfunction in each reverse bias switch 3 which is caused by a noise introduced between the preliminary driving circuit 16 and each reverse bias switch 3 can be prevented.

Second Embodiment

Figure 6:
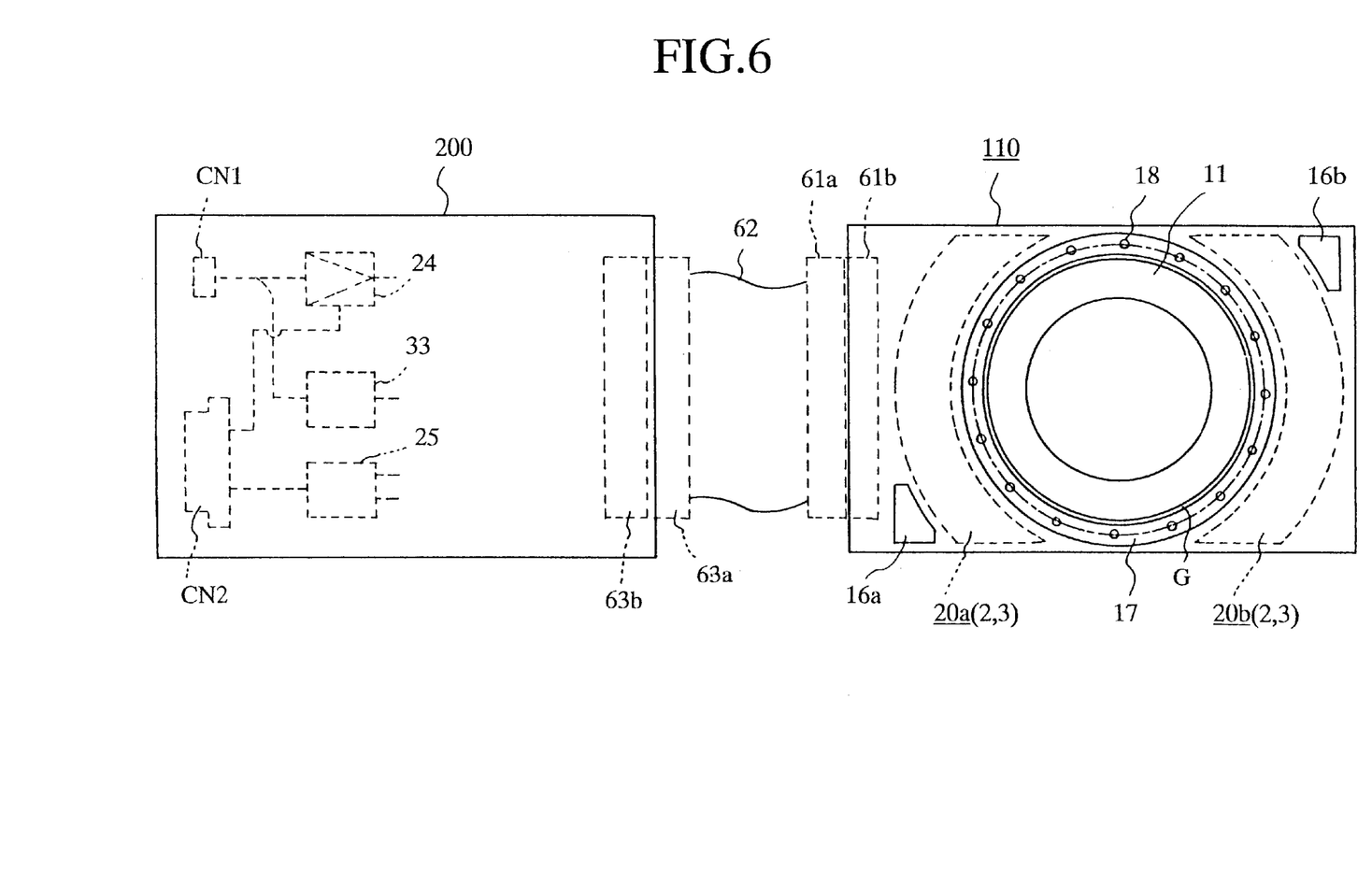
FIG. 6 is a plan view showing the structure of a power semiconductor switching device according to a second embodiment of the present invention.

Referring next to FIG. 6, there is illustrated a plan view showing the structure of a power semiconductor switching device according to a second embodiment of the present invention. In the figure, reference numerals 20a and 20b denote first and second reverse bias driving circuits which are separated from each other and are arranged on two respective regions on the mounting board 110, 16a and 16b denote first and second preliminary driving circuits which correspond to the first and second reverse bias driving circuits 20a and 20b, respectively, 61a and 61b denote a pair of connectors for electrically connecting both the first and second reverse bias driving circuits 20a and 20b separately disposed on the mounting board 110 to a cable 62, 63a and 63b denote another pair of connectors for electrically connecting the cable 62 to the forward bias driving circuit 24, the reverse bias power supply 25, the buffer circuit 33, and so on, and 200 denotes another board on which the forward bias driving circuit 24, the reverse bias power supply 25, the buffer circuit 33, and so on are contained. The other substrate 200 can be located separately from the mounting board 110, as shown in FIG. 6.

As shown in FIG. 6, the mounting board 110 of the second embodiment on which the GTO element 11 is mounted and the first and second reverse bias driving circuits 20a and 20b are contained is shaped like a rectangle so that the length of the shorter side is nearly equal to the outer diameter of the ferrule 17 for securing the gate electrode G of the GTO element 11 to the mounting board 110 and the length of the longer side is greater than the outer diameter of the ferrule 17 in such a manner that the first and second reverse bias driving circuits 20a and 20b are located on the two respective regions on the mounting board 110 which are arranged in the longitudinal direction of the rectangular mounting board 110 and which are separated from each other by the GTO element 11. The shorter width of the mounting board 110 can be thus reduced as compared with the structure of the first embodiment in which the reverse bias driving circuit is arranged consistently around the entire perimeter of the GTO element 11. Accordingly, when stacking a plurality of mounting boards 110 each having such the structure and mounting one GTO element 11, the spacing between bolts or the width of a belt required for securing all of the plurality of GTO elements stacked together with each other can be reduced. Furthermore, this results in improving the mechanical strength in stacking and reducing the size of the stacked set of GTO elements.

Since the forward bias driving circuit 24 is contained on the other board 200 which is different and separate from the mounting board 110 on which the first and second reverse bias driving circuits 20a and 20b are included, the forward bias driving circuit 24 is resistant to a noise caused by the large reverse bias current with a high rate of change ($-dIg/dt$). Furthermore, arranging the forward bias driving circuit 24 apart from the GTO element 11, near which there is no sufficient free space for mounting other components, improves the flexibility of the implementation of the power semiconductor switching device.

In addition, since the first and second preliminary driving circuits 16a and 16b for driving the number of reverse bias switches in the first and second reverse bias driving circuits 20a and 20b which are arranged separately in the two respective regions are similarly mounted in the respective regions on the mounting board 110 for the respective reverse bias driving circuits 20a and 20b, the loop impedance of the gate circuit used for the number of reverse bias switches 3 of each of the first and second reverse bias driving circuits 20a and 20b can be reduced. As a result, voltages applied to the gates of the number of reverse bias switches 3 can be stabilized and hence a malfunction in each reverse bias switch 3 which is caused by a noise introduced between each of the first and second preliminary driving circuits 16a and 16b and each reverse bias switch 3 driven by the first or second preliminary driving circuit 16a or 16b can be prevented.

Since the reverse bias power supply 25 for the first and second reverse bias driving circuits 20a and 20b is included on the other board 200 which is different and separate from the mounting board 110 on which the first and second reverse bias driving circuits 20a and 20b are contained, and hence the reverse bias power supply 25 is located apart from the mounting board 110 including the GTO element 11 near which there is no sufficient free space for mounting other components, the flexibility of the implementation of the power semiconductor switching device is improved. Furthermore, since the forward bias driving circuit 24 is included on the other board 200 which is different and separate from the mounting board 110, the flexibility of the implementation of the power semiconductor switching device is improved.

Figure 7A:
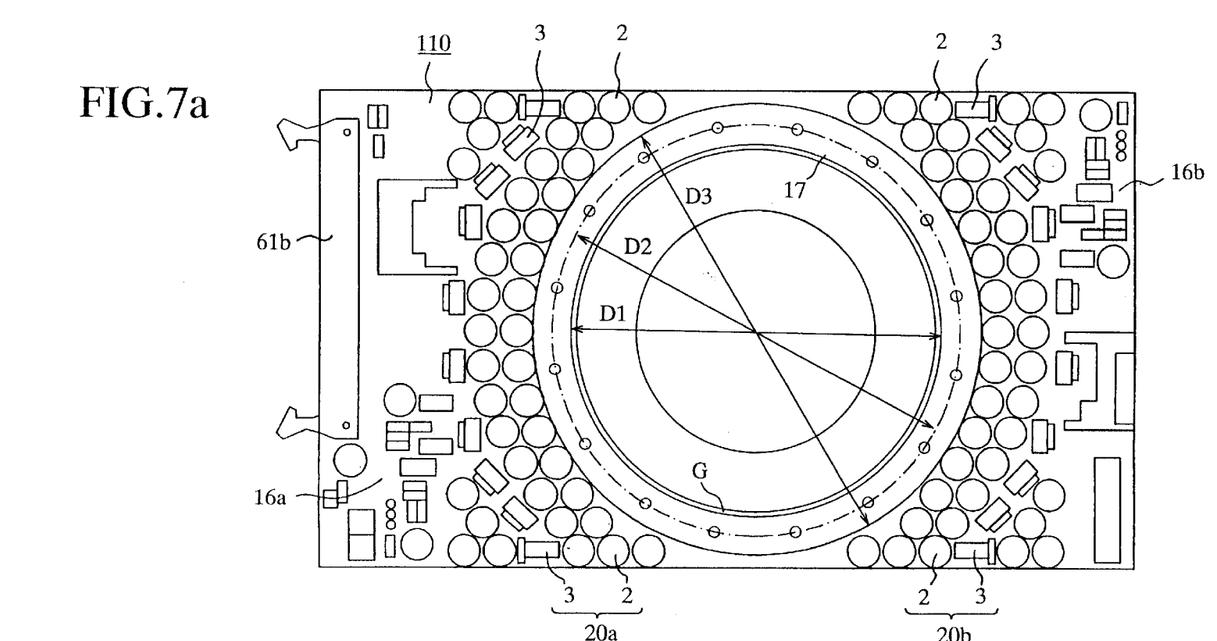
FIG. 7a is a plan view showing the structure of the power semiconductor switching device according to the second embodiment of the present invention shown in FIG. 6.
Figure 7B:
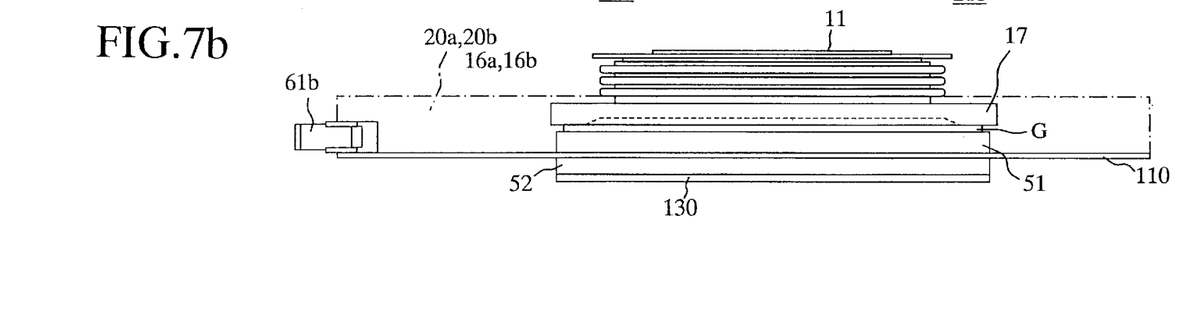
Figure 8A:
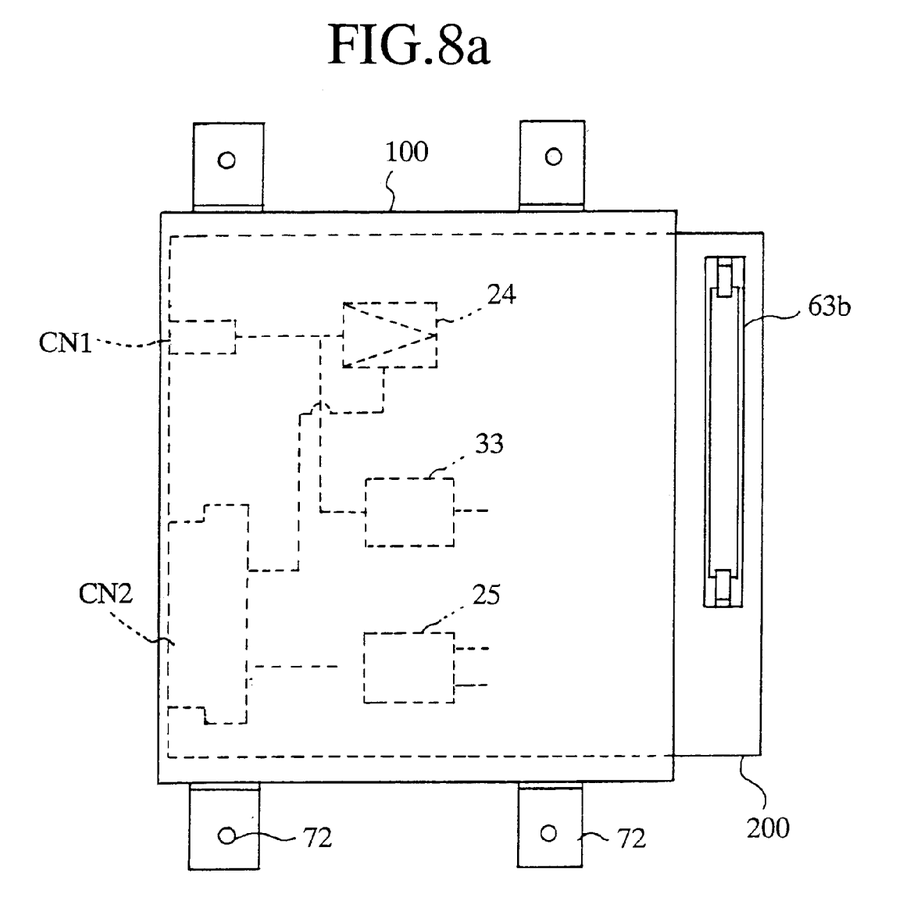
FIG. 8a is a plan view showing the structure of another board and a chassis which houses the other board in the power semiconductor switching device according to the second embodiment of the present invention shown in FIG. 6.
Figure 8B:
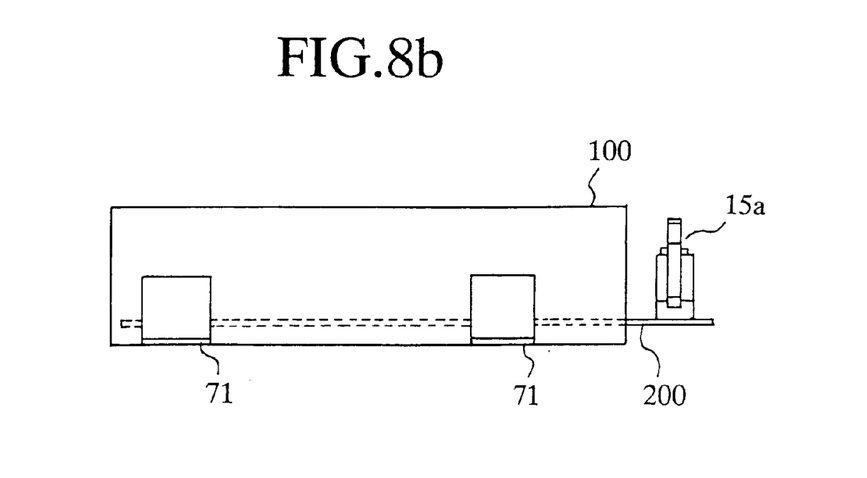

Referring next to FIGS. 7a and 7b, there are illustrated a plan view and a side view showing the detailed structure of the power semiconductor switching device according to the second embodiment of the present invention shown in FIG. 6. Furthermore, FIGS. 8a and 8b are a plan view and a side view showing the detailed structure of the board 200 of the power semiconductor switching device according to the second embodiment of the present invention shown in FIG. 6, and the chassis 100 which houses the board 200. In those figures, the same components and members as those shown in FIG. 6 and like components and members are designated by the same reference numerals. In FIGS. 8a and 8b, reference numeral 71 denotes a mounting foot for securing the chassis 100 housing the board 200 on which the forward bias driving circuit 24, the reverse bias power supply 25, and so on are contained, and 72 denotes a hole formed in each mounting foot 71. The chassis 100 is secured to a desired installation position using four mounting screws through the holes 72 in the four mounting feet 71. In FIG. 7b, while the whole of the ferrule 17 and the metallic space 51 can be seen, actually, they are partially hidden from view by the reverse bias driving circuits 20a and 20b.

Figure 9A:
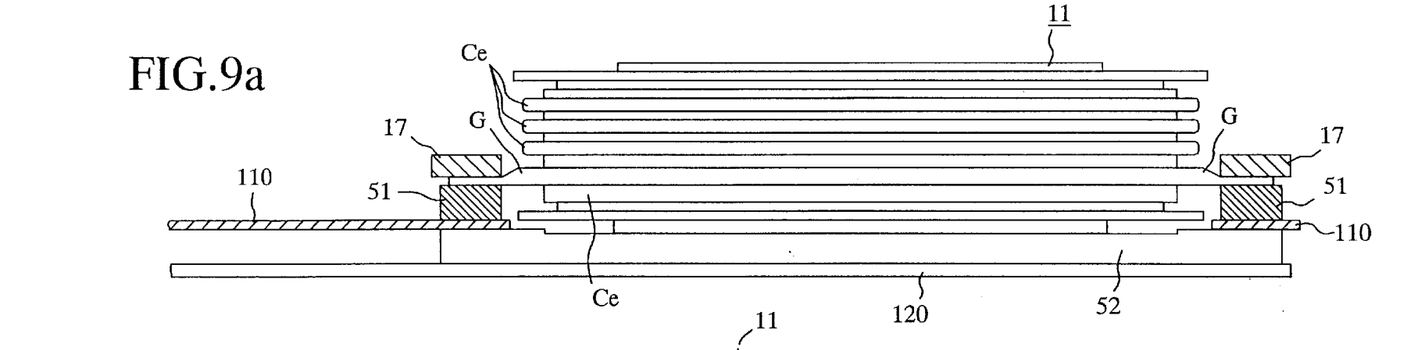
FIG. 9a is a side view, partially in section, showing the structure of a power semiconductor switching element of the power semiconductor switching device according to the second embodiment of the present invention shown in FIGS. 7a and 7b.
Figure 9B:
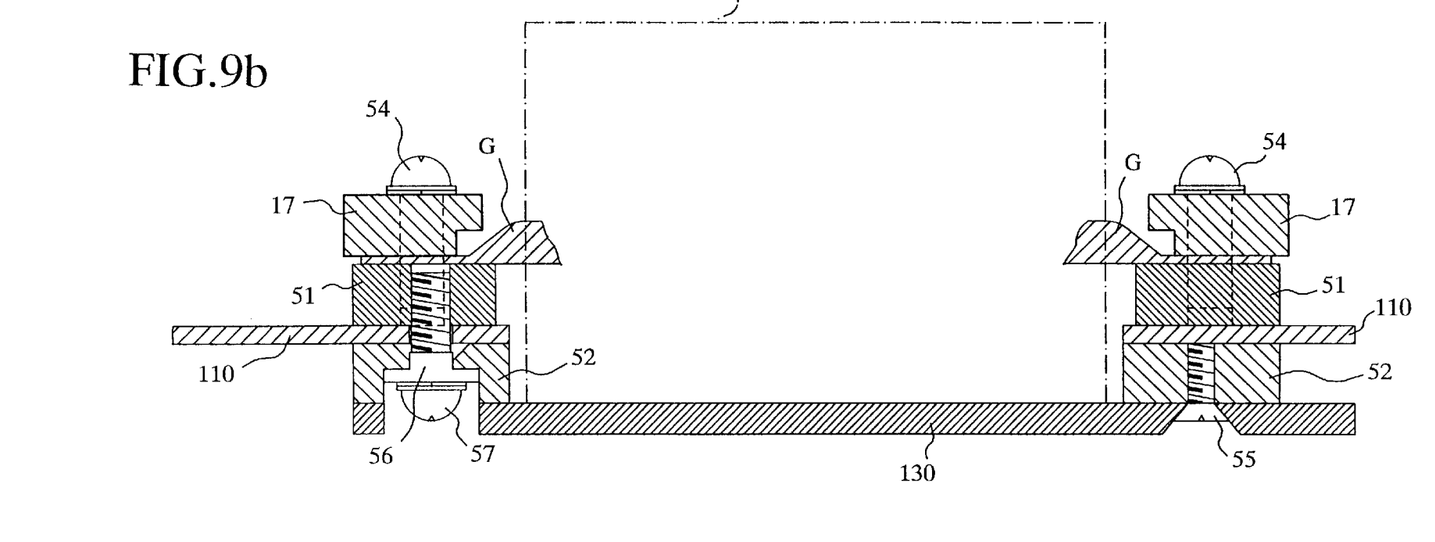

Referring next to FIG. 9a, there is illustrated a side view, partially in section, showing the installation of the GTO element 11 into the power semiconductor switching device according to the second embodiment of the present invention shown in FIG. 6. Furthermore, FIG. 9b shows a cross-sectional view showing the GTO element 11 mounted on the mounting board 110 shown in FIG. 9a. In those figures, the same components and members as those shown in FIGS. 5a and 5b and like components and members are designated by the same reference numerals. The power semiconductor switching device according to the second embodiment is provided with a highly conductive metallic plate 130 which is secured to the metallic spacer 52 with a plurality of screws 55, instead of the highly conductive metallic plate 120 shown in FIGS. 5a and 5b. The highly conductive metallic plate 130 is securely brought into contact with the bottom surface of the second main electrode (not shown) of the GTO element 11 so that the upper surface of the highly conductive metallic plate 130 is in electrical contact with the bottom surface of the second main electrode, like the highly conductive metallic plate 120 of the first embodiment. The highly-conductive metallic plate 130 is not coupled to the chassis 100 shown in FIGS. 8a and 8b, unlike the highly conductive metallic plate 120 of the first embodiment.

In the power semiconductor switching device of the second embodiment which is so constructed as mentioned above, the mounting board 110 is electrically connected to the other board 200 by way of the connectors 61a, 61b, 63a, and 63b, and the cable 62 connecting the connector 61a to the connector 63a. Thus the board 200 can be freely mounted within application devices which are located apart from the mounting board 110. Accordingly, when arranging and mounting or installing a snubber, a clamping circuit, a voltage clamping circuit, a cooling mechanism, and the necessary wiring using a highly conductive metallic plate (or a highly conductive metallic line or a bus) in order to stack a plurality of mounting boards 110 of this embodiment on each of which the GTO element 11 is contained, those components can be arranged optimally according to the most favorable conditions for arrangement of each component, constraints placed on arrangement of each component, and their priorities assigned to arrangement of those components. This results in improving the flexibility of the implementation of a plurality of power semiconductor switching devices.

As shown in FIGS. 7a, 7b, 9a, and 9b, the power semiconductor switching device according to the second embodiment is so constructed as to sandwich the gate electrode G and the mounting board 110 on which the first and second reverse bias driving circuits 20a and 20b and the first and second preliminary driving circuits 16a and 16b are mounted between the ferrule 17 and the highly conductive metallic plate 130. Accordingly, the power semiconductor switching device of the second embodiment of the present embodiment provides high mechanical strength. In addition, the ferrule 17 and the metallic spacer 51 serve to make the potential of the gate electrode G consistent across the entire perimeter of the ring-shaped gate electrode G. In other words, the reverse bias applied to the gate electrode G is consistent across the entire perimeter of the ring-shaped gate electrode G. This results in improving the interruption capability of the power semiconductor switching device.

As previously mentioned, the present invention offers the following advantages.

In accordance with a preferred embodiment of the present invention, there is provided a power semiconductor switching device comprising: a power semiconductor switching element housed within a flat package and provided with first and second main flat electrodes between which a main current flows when the power semiconductor switching element is turned on, and a control electrode which is shaped like a ring and which projects outwardly from the flat package and pairs up with the second main flat electrode for controlling electrical conduction between the first and second main flat electrodes; a forward bias driving circuit for applying a forward bias between the control electrode and the second main electrode; a reverse bias driving circuit ; the reverse bias driving circuit including a plurality of storage elements arranged around the perimeter of the control electrode of the power semiconductor switching element, for storing an electric energy supplied by a reverse bias power supply to apply a reverse bias between the control electrode and the second main electrode, and a plurality of switching elements each connected in series to each of the plurality of storage elements, which can be turned on to apply the electric energy stored in the plurality of storage elements between the control electrode and the second main electrode; and a mounting board on which the reverse bias driving circuitry is contained, the mounting board having a through hole through which the second main electrode of the power semiconductor switching element penetrates so that the flat package is located in the proximity of the through hole and the perimeter of the through hole partially surrounds the flat package, and a conducting member formed on one surface of the mounting board and electrically connected to the control electrode of the power semiconductor switching element. Accordingly, a thermal adverse effect on the reverse bias driving circuitry due to heat generated in the power semiconductor wafer is reduced and hence the power semiconductor switching device of the embodiment can ensure a high degree of reliability.

In addition, since the reverse bias driving circuitry is arranged around the perimeter of the ring-shaped control electrode projecting from the flat package, a reverse bias is applied consistently to the entire control electrode and the loop impedance of the reverse bias driving circuitry is decreased. Thus the reverse bias driving circuitry can apply a reverse bias having a high rate of change of current and having a large amount of current even though the amplitude of the bias voltage generated by the reverse bias power supply is limited, thereby improving the interruption capability of the power semiconductor switching device.

Preferably, the device further comprises a highly conductive metallic plate which is securely brought into contact with one flat surface of the second main electrode and a highly conductive ferrule. Furthermore, the highly conductive metallic plate and the ferrule sandwich the control electrode and the mounting board between them in cooperation with each other. Accordingly, the power semiconductor switching device provides high mechanical strength. In addition, the highly conductive ferrule serves to make the gate potential consistent across the entire peripheral portion of the ring-shaped gate electrode. In other words, the reverse bias is applied consistently to the entire control electrode. This results in improving the interruption capability and the reliability by mechanical means of the power semiconductor switching device.

In a preferred embodiment, the forward bias driving circuit is located apart from the reverse bias driving circuitry. Accordingly, the forward bias driving circuit is resistant to an induced noise caused by a large reverse bias current with a high rate of change of current. Furthermore, arranging the forward bias driving circuit apart from the power semiconductor switching element improves the flexibility of the implementation of the power semiconductor switching device of this embodiment. The power semiconductor switching device can comprise another board which is separated from the mounting board on which the reverse bias driving circuitry is contained, and the forward bias driving circuit can be contained on the other board. Accordingly, an adverse effect on the forward bias driving circuit due to an induced noise, which is caused by a large reverse bias current with a high rate of change of current, can be further reduced. Furthermore, arranging the forward bias driving circuit apart from the power semiconductor switching element improves the flexibility of the implementation of the power semiconductor switching element and the forward bias driving circuit of the power semiconductor switching device of this embodiment.

Preferably, the reverse bias power supply is also contained on the other board. The flexibility of the implementation of the power semiconductor switching element and the reverse bias driving circuitry can be thus improved.

The power semiconductor switching device can further comprise a preliminary driving circuit disposed on the mounting board and located in the vicinity of the reverse bias driving circuitry, for driving the plurality of switching elements of the reverse bias driving circuitry. Accordingly, the loop impedance of a circuit including the reverse bias driving circuitry and the second main and gate electrodes can be reduced. As a result, voltages applied to the gates of the number of switching elements of the reverse bias driving circuitry can be stabilized and hence a malfunction in each switching element which is caused by a noise introduced between the preliminary driving circuit and each switching element of the reverse bias driving circuitry can be prevented. The reliability of the power semiconductor switching device is thus improved.

In accordance with another preferred embodiment of the present invention, the through hole divides one surface of the mounting board on which the reverse bias driving circuitry is contained into two surface regions, and the reverse bias driving circuitry includes first and second reverse bias driving circuits which are separately disposed on the two respective surface regions which are opposite to each other across the through hole. Accordingly, the shorter side of the mounting board can have a width sufficient for mounting at least the flat package. The width of the mounting board can be reduced as compared with the structure in which the reverse bias driving circuitry is arranged around the entire perimeter of the control electrode. Therefore, when stacking a plurality of such mounting boards on each of which a power semiconductor switching element and so on are contained, the spacing between bolts or the width of a belt required for securing all of the plurality of power semiconductor switching elements stacked together with each other can be reduced. Furthermore, this results in improving the mechanical strength in stacking and reducing the size of the stacked set of power semiconductor switching elements.

Preferably, the power semiconductor switching device comprises first and second preliminary driving circuits disposed on the two respective surface regions of the mounting board, for respectively driving corresponding switching elements of the first and second reverse bias driving circuits which are contained on the two respective surface regions on the mounting board. The width of the mounting board can be reduced as compared with the structure in which the reverse bias driving circuitry is arranged around the entire perimeter of the control electrode. Therefore, when stacking a plurality of such mounting boards on each of which a power semiconductor switching element and so on are contained, the spacing between bolts or the width of a belt required for securing all of the plurality of power semiconductor switching elements stacked together with each other can be reduced. Furthermore, this results in improving the mechanical strength in stacking and reducing the size of the stacked set of power semiconductor switching elements. The loop impedance of a circuit including the reverse bias driving circuitry and the second main and gate electrode can be reduced. As a result, voltages applied to the gates of the number of switching elements of the first and second reverse bias driving circuits can be stabilized and hence a malfunction in each switching element which is caused by a noise introduced between each of the first and second preliminary driving circuits and each switching element of the first or second reverse bias driving circuits can be prevented. The reliability of the power semiconductor switching device is thus improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A power semiconductor switching device comprising:
   a power semiconductor switching component housed within a flat package and provided with first and second main flat electrodes between which a main current flows when said power semiconductor switching component is turned on, and a control electrode which is shaped like a ring and which projects outwardly from the flat package and pairs up with said second main flat electrode for controlling electrical conduction between said first and second main flat electrodes;
   forward bias driving circuitry for applying a forward bias between said control electrode and said second main electrode;
   reverse bias driving circuitry including:
      storage elements arranged around the perimeter of said control electrode of said power semiconductor switching component, wherein said storage elements store an electric energy supplied by a reverse bias power supply circuitry to apply a reverse bias between said control electrode and said second main electrode, and switching units connected in series to said storage elements, wherein said switching units can be turned on to apply the electric energy stored in said storage elements between said control electrode and said second main electrode; and a mounting board on which said reverse bias driving circuitry is contained, said mounting board having a through hole through which said second main electrode of said power semiconductor switching component penetrates so that said flat package is located in the proximity of the through hole and the perimeter of the through hole partially surrounds the flat package, and a conducting member formed on one surface of said mounting board and electrically connected to said control electrode of said power semiconductor switching component.

2. The power semiconductor switching device according to claim 1, wherein said device further comprises a highly conductive metallic plate which is securely brought into contact with one flat surface of said second main electrode and a highly conductive ferrule, and wherein said highly conductive metallic plate and said highly conductive ferrule sandwich said control electrode and said mounting board between them in cooperation with each other.

3. The power semiconductor switching device according to claim 1, wherein said forward bias driving circuitry is located apart from said reverse bias driving circuitry.

4. The power semiconductor switching device according to claim 3, further comprising another board which is separated from said mounting board on which said reverse bias driving circuitry is contained, and wherein said forward bias driving circuitry is contained on said other board.

5. The power semiconductor switching device according to claim 4, wherein said reverse bias power supply circuitry is contained on said other board.

6. The power semiconductor switching device according to claim 1, further comprising preliminary driving circuitry disposed on said mounting board and located in the vicinity of said reverse bias driving circuitry, for driving said switching units of said reverse bias driving circuitry.

7. The power semiconductor switching device according to claim 1, wherein said through hole divides one surface of said mounting board on which said reverse bias driving circuitry is contained into two surface regions, and said reverse bias driving circuitry includes first and second reverse bias driving circuits which are separately disposed on the two respective surface regions which are opposite to each other across said through hole.

8. The power semiconductor switching device according to claim 7, wherein said device further comprises a highly conductive metallic plate which is securely brought into contact with one flat surface of said second main electrode and a highly conductive ferrule, and wherein said highly conductive metallic plate and said highly conductive ferrule sandwich said control electrode and said mounting board between them in cooperation with each other.

9. The power semiconductor switching device according to claim 7, wherein said forward bias driving circuitry is located apart from said reverse bias driving circuitry.

10. The power semiconductor switching device according to claim 9, further comprising another board which is separated from said mounting board on which said reverse bias driving circuitry is contained, and wherein said forward bias driving circuitry is contained on said other board.

11. The power semiconductor switching device according to claim 10, wherein said reverse bias power supply circuitry is contained on said other board.

12. The power semiconductor switching device according to claim 7, further comprising first and second preliminary driving circuits disposed on the two respective surface regions of said mounting board, for respectively driving corresponding switching units of said first and second reverse bias driving circuits which are contained on the two respective surface regions on said mounting board.

* * * * *